United States Patent
Kimura (10) Patent No.: US 7,854,061 B2
(45) Date of Patent: Dec. 21, 2010

(54) COMPONENT MOUNTING APPARATUS, VIBRATION CONTROLLING APPARATUS, AND VIBRATION CONTROLLING METHOD

(75) Inventor: Akira Kimura, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 12/318,638

(22) Filed: Jan. 5, 2009

(65) Prior Publication Data

US 2009/0217514 A1    Sep. 3, 2009

(30) Foreign Application Priority Data

Feb. 29, 2008    (JP) ............................. 2008-049421

(51) Int. Cl.
*B23P 19/00*    (2006.01)
(52) U.S. Cl. .................... 29/739; 29/564; 29/564.1; 29/740; 29/832
(58) Field of Classification Search .............. 29/739, 29/832, 740, 564, 564.1
See application file for complete search history.

(56) References Cited

U.S. PATENT DOCUMENTS 5,862,586 A * 1/1999 Kimura ........................ 29/832

7,340,827 B2    3/2008 Saito et al.
2006/0206237 A1 * 9/2006 Morisada ..................... 700/280

FOREIGN PATENT DOCUMENTS

| JP | 2001-223498   | 8/2001 |
| JP | 2003-084838 A | 3/2003 |
| JP | 2005-150638   | 6/2005 |

OTHER PUBLICATIONS

Japanese Office Action issued Sep. 29, 2009 for corresponding Japanese Application No. 2008-049421.

* cited by examiner

*Primary Examiner*—Derris H Banks
*Assistant Examiner*—Azm Parvez
(74) *Attorney, Agent, or Firm*—Rader, Fishman & Grauer PLLC (57) ABSTRACT

A component mounting apparatus mounting a component on a substrate includes a driving unit, a frame structure, a first outputting section, and a compensating section. The driving unit includes a head to hold the component and a driving mechanism to move the head. The frame structure is equipped with the driving unit. The first outputting section detects a vibration of the frame structure and outputs first displacement information as displacement information of the frame structure caused by the detected vibration. The compensating section compensates a position of the head that moves by the driving mechanism based on the first displacement information.

10 Claims, 7 Drawing Sheets

COMPONENT MOUNTING APPARATUS, VIBRATION CONTROLLING APPARATUS, AND VIBRATION CONTROLLING METHOD

CROSS REFERENCES TO RELATED APPLICATIONS

The present invention contains subject matter related to Japanese Patent Application JP 2008-049421 filed in the Japanese Patent Office on Feb. 29, 2008, the entire contents of which being incorporated herein by reference.

BACKGROUND OF THE INVENTION

1. Field of the Invention

The present invention relates to a component mounting apparatus for mounting a component on a substrate and the like, and a vibration controlling apparatus and a vibration controlling method applied thereto.

2. Description of the Related Art

From the past, a mounting apparatus for mounting an electronic component on a substrate includes a horizontally-moving head for holding the electronic component. The head is attached with, for example, a nozzle for sucking the electronic component in vacuum. A vertical movement of the nozzle causes the nozzle to approach the substrate and be detached therefrom so that the electronic component is mounted on the substrate (see, for example, Japanese Patent Application Laid-open No. 2005-150638 (paragraph [0032], FIGS. 1 to 3)).

In the mounting apparatus described in Japanese Patent Application Laid-open No. 2005-150638 (paragraph [0032], FIGS. 1 to 3), a frame that is constituted of a beam (15), a head mounting beam (16), and the like and that movably supports a head (17) vibrates by a movement of the head (17). If the frame is still vibrated while the head (17) is mounting the electronic component on a substrate (19), positional accuracy in mounting with respect to the substrate deteriorates. In this regard, devices such as designing a high-rigidity frame or slowing a movement velocity of the head (17) as much as possible have been made so that no vibration of the frame is left. However, when the movement velocity of the head (17) is slow, it becomes difficult to improve a throughput of the mounting apparatus.

Meanwhile, a mounting apparatus including two heads that are driven independently is disclosed (see, for example, Japanese Patent No. 3494153 (paragraph [0033], FIGS. 1 to 4)).

SUMMARY OF THE INVENTION

However, when the two heads are driven independently, by moving one head while the other head is mounting the electronic component on the substrate, a vibration of the frame occurs. Therefore, to solve such a problem, provided is a system that controls a vibration by detecting a vibration of a base portion (2) and the like supporting the frame, and imparting a vibration in a direction opposite to the vibration to the base portion (2) (active control), for example.

Even in this case, however, because the frame vibrates when the head moves, the vibration to the head cannot be removed completely.

In view of the circumstances as described above, there is a need for a component mounting apparatus capable of positioning a movable body such as a head with high accuracy even when a structure such as a frame is vibrated, and a vibration controlling apparatus and vibration controlling method applied thereto.

According to an embodiment of the present invention, there is provided a component mounting apparatus mounting a component on a substrate, including a driving unit, a frame structure, a first outputting means, and a compensating means. The driving unit includes a head to hold the component and a driving mechanism to move the head. The frame structure is equipped with the driving unit. The first outputting means detects a vibration of the frame structure and outputs first displacement information as displacement information of the frame structure caused by the detected vibration. The compensating means compensates a position of the head that moves by the driving mechanism based on the first displacement information.

In the embodiment of the present invention, even when the frame structure is vibrated, the position of the head is compensated based on the displacement information caused by the vibration of the frame structure. Therefore, an absolute movement position of the head is secured, and highly-accurate positioning of the head with respect to the substrate becomes possible.

The component mounting apparatus further includes a base portion and a second outputting means. The base portion supports the frame structure. The second outputting means detects a vibration of the base portion and outputs second displacement information as displacement information of the base portion caused by the detected vibration. Further, the compensating means compensates the position of the head that moves by the driving mechanism based on the first displacement information and the second displacement information. According to the embodiment of the present invention, even when the base portion is vibrated, an absolute movement position of the head is secured.

For example, the compensating means causes the driving mechanism to drive so that positional information of the head is offset by as much as the first displacement information. Alternatively, the compensating means causes the driving mechanism to drive so that positional information of the head is offset by as much as the first displacement information and the second displacement information.

The head included in the driving unit is provided plurally, the driving mechanism moves each of the plurality of heads independently, and the compensating means compensates the position of each of the plurality of heads that moves by the driving mechanism based on the first displacement information. Because the plurality of heads are provided as described above, even when a second head moves and causes the frame body to vibrate while a first head is mounting a component on the substrate, an absolute movement position of the head is secured.

The first outputting means includes an acceleration sensor, a generating means, a judging means, and a resetting means. The acceleration sensor detects an acceleration of the vibration of the frame structure. The generating means generates the first displacement information by integrating the acceleration value. The judging means judges whether the acceleration value detected by the acceleration sensor is equal to or smaller than a threshold value. The resetting means resets the first displacement information to 0 when the acceleration value is equal to or smaller than the threshold value. Accordingly, when generating the first displacement information by integrating the detected acceleration value, generation of an accumulated error in the integration can be suppressed.

According to an embodiment of the present invention, there is provided a vibration controlling apparatus controlling a vibration of a movable body caused by a vibration of a frame structure to support the movable body and a driving mechanism to move the movable body, including an outputting means and a compensating means. The outputting means detects the vibration of the frame structure and outputs displacement information of the frame structure caused by the detected vibration. The compensating means compensates a position of the movable body that moves by the driving mechanism based on the displacement information of the frame structure.

According to an embodiment of the present invention, there is provided a vibration controlling method including detecting a vibration of a frame structure to support a movable body and a driving mechanism to move the movable body, outputting displacement information of the frame structure caused by the detected vibration, and compensating a position of the movable body that moves by the driving mechanism based on the displacement information of the frame structure.

According to an embodiment of the present invention, there is provided a vibration controlling apparatus controlling a vibration of a movable body caused by a vibration of a frame structure to support the movable body and a driving mechanism to move the movable body, including an outputting section and a compensating section. The outputting section detects the vibration of the frame structure and outputs displacement information of the frame structure caused by the detected vibration. The compensating section compensates a position of the movable body that moves by the driving mechanism based on the displacement information of the frame structure.

As described above, according to the embodiments of the present invention, a movable body such as a head can be positioned with high accuracy even when a structure such as a frame is vibrated.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will be described with reference to the drawings.

Figure 1:
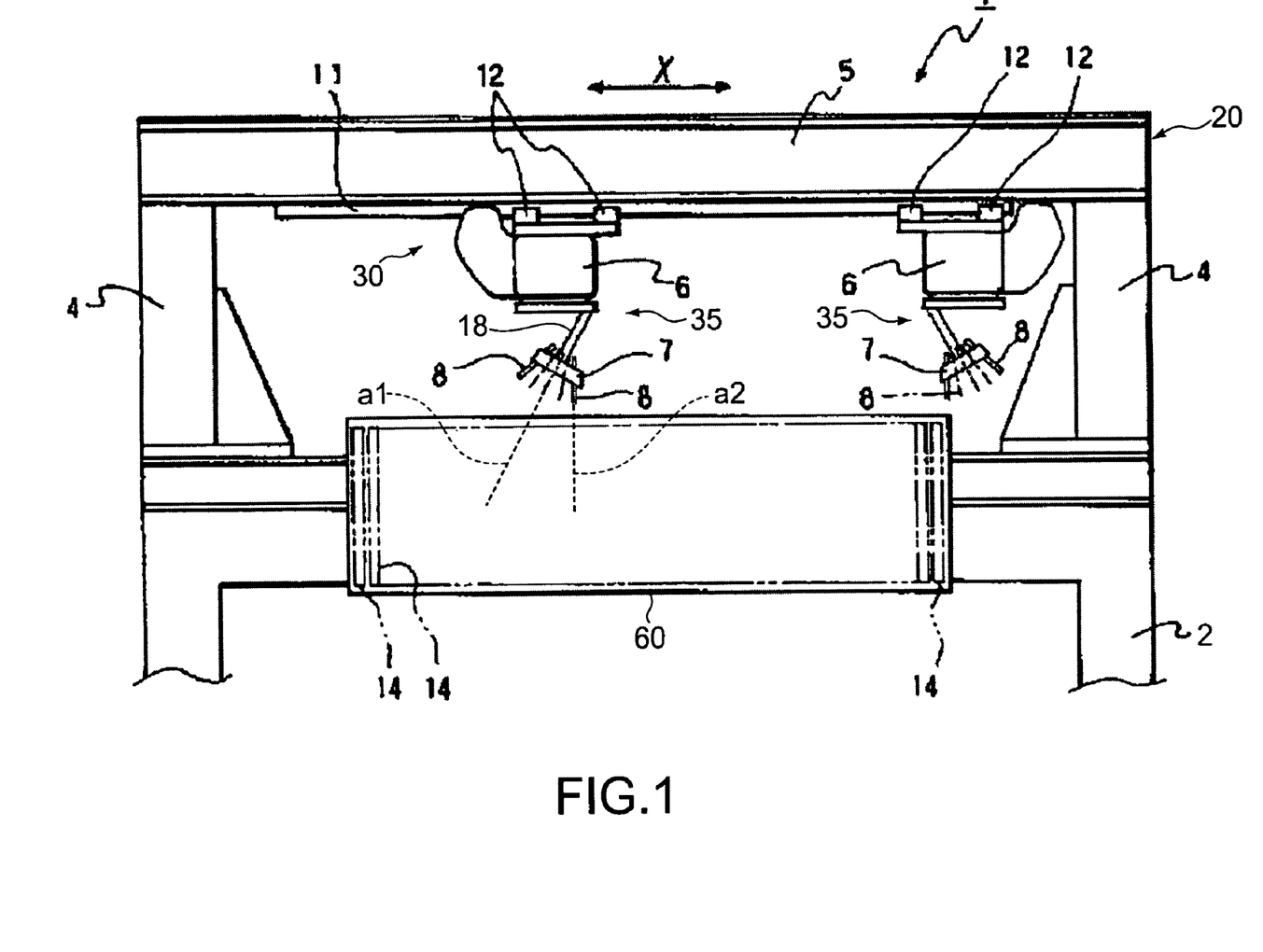
FIG. 1 is a front view of a component mounting apparatus according to an embodiment of the present invention.
Figure 2:
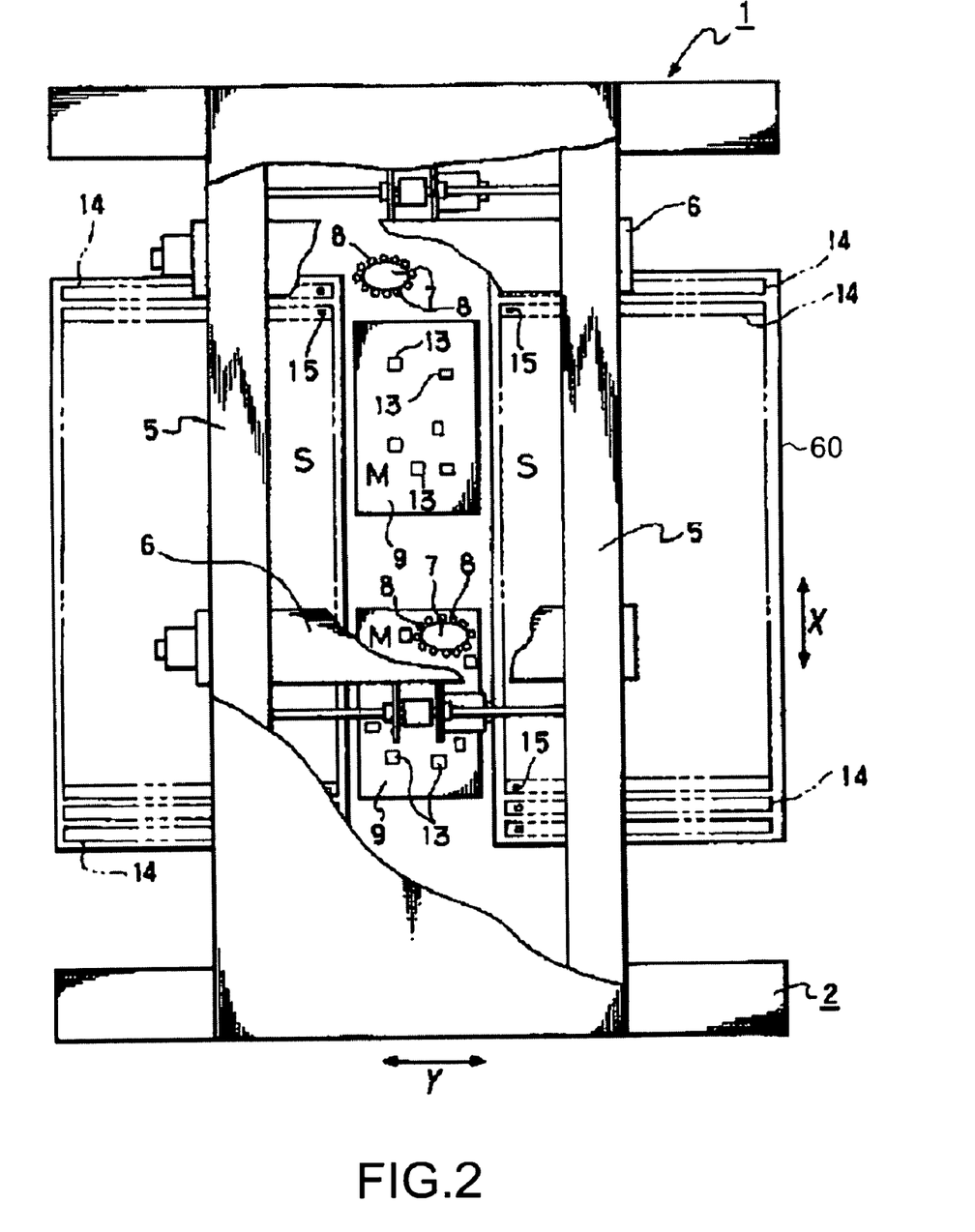
FIG. 2 is a plan view of the partially-fractured component mounting apparatus.
Figure 3:
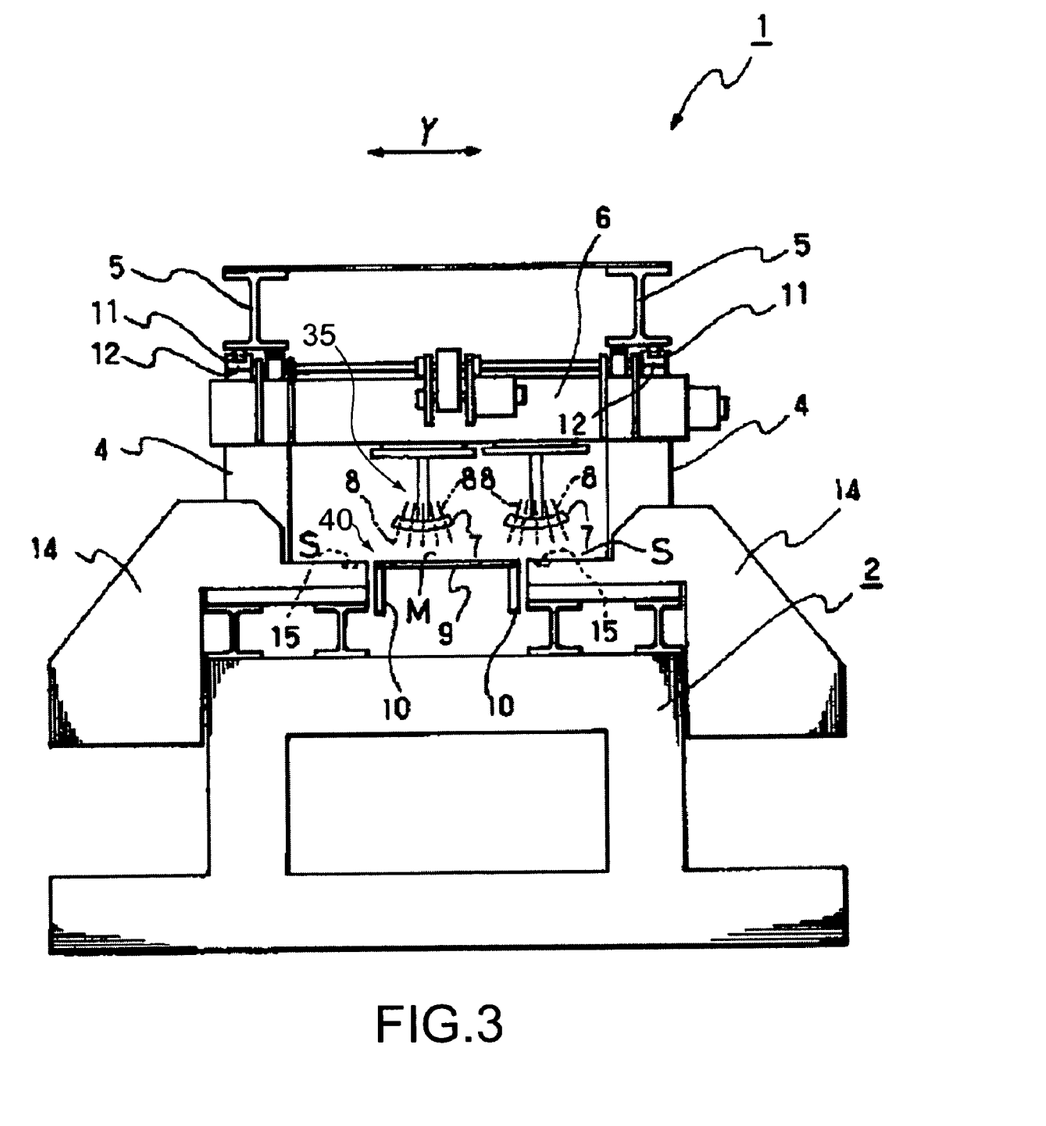
FIG. 3 is a side view of the component mounting apparatus.

FIG. 1 is a front view of a component mounting apparatus 1 according to an embodiment of the present invention. FIG. 2 is a plan view of the partially-fractured component mounting apparatus 1. FIG. 3 is a side view of the component mounting apparatus 1.

The component mounting apparatus 1 includes a substrate arranging portion 40 which is provided substantially at the center thereof and on which a circuit board 9 is placed, and arranging portions 60 which is provided on both sides of the substrate arranging portion 40 and on which component supplying apparatuses 14 are disposed.

The component mounting apparatus 1 also includes a base portion 2 and a frame structure 20 supported by the base portion 2. The frame structure 20 includes a plurality of supporting columns 4 erected on the base portion 2, and a beam 5 bridged between, for example, two supporting columns 4. With four supporting columns 4, for example, two beams 5 are provided. In descriptions below, a direction in which the beam 5 extends may be referred to as an X-axis direction, a direction orthogonal to the X axis within a horizontal plane may be referred to as a Y-axis direction, and a vertical direction may be referred to as a Z-axis direction.

The frame structure 20 is equipped with a driving unit that includes a head 35 (movable body) for holding an electronic component 13 from the component supplying apparatus 14 and a driving mechanism 30 for driving the head 35. The head 35 and a moving member 6 (described later) included in the driving mechanism 30 are each provided plurally, like two each, for example. Since structures of the two heads 35 are the same, unless there is a need to specifically focus on the two heads 35, descriptions will be given on only one of the heads 35 in describing the structure of the heads 35 and the like hereinafter.

Typically, the driving mechanism 30 includes the moving member 6 extending in the Y-axis direction and movable in the X-axis direction, guided bodies 12 fixed on an upper surface of the moving member 6 at both end portions, and a guide rail 11 extending in the X-axis direction on a lower surface of the beam 5 and that guides a movement of the guided bodies 12. The guide rail 11 is commonly used by the two heads 35 (and two moving members 6). However, it is also possible to provide the guide rail 11 for each of the heads 35 (and two moving members 6).

With the structure of the driving mechanism 30 as described above, the moving member 6 is movable in the X-axis direction along the beam 5. Moreover, the head 35 connected to the moving member 6 is also movable in the X-axis direction. It should be noted that a ball screw driving mechanism, for example, is used as a driving system for moving the moving member 6 as will be described later. However, the present invention is not limited thereto, and a belt driving mechanism, a linear motor driving mechanism, or other driving mechanisms may be used instead.

Typically, the head 35 includes sucking nozzles 8, a nozzle holding portion 7 for holding the sucking nozzles 8, and a supporting portion 18 for supporting the nozzle holding portion 7. The supporting portion 18 is connected to the moving member 6, and the head 35 is thus movable in the Y-axis direction by driving of a ball screw provided inside the moving member 6. Also in this case, a belt driving mechanism, a linear motor driving mechanism, or other driving mechanisms may be used instead of the ball screw.

With the structure as described above, the head 35 is movable within an X-Y plane.

The substrate arranging portion 40 is provided with a fixing mechanism 10 for fixing the circuit board 9 by supporting it from the bottom. The circuit board 9 is positioned by the fixing mechanism 10. In this embodiment, two circuit boards 9 are placed on the substrate arranging portion 40 with a predetermined gap therebetween. However, the number of circuit boards 9 to be placed is not limited thereto.

The nozzle holding portion 7 is hanged from the supporting portion 18. The nozzle holding portion 7 is rotatable in both the positive and negative directions by a built-in motor (not shown). As shown in FIG. 1, a main rotary axis a1 of the nozzle holding portion 7 is tilted with respect to the Z-axis direction.

The nozzle holding portion 7 is provided with, for example, at an outer circumferential portion thereof, 12 sucking nozzles 8 disposed at regular intervals in a circumferential direction. Each of the sucking nozzles 8 is mounted to the nozzle holding portion 7 so that an axis line thereof is tilted with respect to the main rotary axis a1 of the nozzle holding portion 7. The tilt is made such that an upper end of the sucking nozzle 8 comes closer to the main rotary axis a1 of the nozzle holding portion 7 than a lower end thereof. In other words, as a whole, the 12 sucking nozzles 8 are provided to the nozzle holding portion 7 so as to be widened toward the end.

Each of the sucking nozzles 8 is supported by the nozzle holding portion 7 to be movable in an axial direction, and is lowered by being pressed downward by a pressing mechanism (not shown) when the sucking nozzle 8 is positioned at an operating position to be described later. The pressing mechanism may be any mechanism such as a cam mechanism, a ball screw mechanism, a solenoid, and an air pressure generating mechanism.

The axis line of the sucking nozzle 8 at a far right end in FIG. 1 faces the Z-axis direction, and the sucking nozzle at the far right end corresponds to the operating position. The electronic component 13 is sucked or released by the sucking nozzle 8 positioned at the operating position and facing the vertical direction.

There are a plurality of types of electronic components 13 to be mounted on a single circuit board 9, but different types of electronic components 13 cannot be sucked and mounted by a single type of sucking nozzle 8. In this regard, a plurality of types of sucking nozzles 8 are provided to suck and mount electronic components 13 respectively corresponding to optimal sucking nozzles 8. Examples of the electronic component 13 include various components such as an IC chip, a resistor, a capacitor, and a coil.

The sucking nozzle 8 is connected to an air compressor (not shown), for example, and a tip end portion of the sucking nozzle 8 positioned at the operating position is switched between a positive pressure and a negative pressure at predetermined timings. Accordingly, the tip end portion sucks or releases the electronic component 13.

As shown in FIGS. 2 and 3, an area occupied by the circuit boards 9 positioned by the fixing mechanism 10 constitutes a component mounting area M.

As shown in FIG. 2, on the arranging portions 60 for the component supplying apparatuses 14 disposed on both the left- and right-hand sides of the component mounting area M, a plurality of component supplying apparatuses 14 are provided detachably. The plurality of component supplying apparatuses 14 are arranged in, for example, the X-axis direction. Though it is possible to mount 40 component supplying apparatuses 14 on each of the arranging portions 60 for the component supplying apparatuses 14, for example, the number of component supplying apparatuses 14 is not limited thereto. Typically, a single component supplying apparatus 14 is a tape feeder that includes a carrier tape accommodating a plurality of electronic components 13 of the same type. Each of the component supplying apparatuses 14 supplies those electronic components 13 to the sucking nozzle 8 as necessary.

The component supplying apparatuses 14 accommodate the electronic components 13 whose types are different for each of the component supplying apparatuses 14. Depending on which electronic component 13 is to be mounted at what position on the circuit board 9, the sucking nozzle 8 and the component supplying apparatus 14 are selected to thus suck the electronic component 13.

It should be noted that although the arranging portions 60 for the component supplying apparatuses 14 are disposed on both the left- and right-hand sides of the component mounting area M in this embodiment, the arranging portion 60 for the component supplying apparatuses 14 may be provided on only one of the left- and right-hand sides of the component mounting area M.

A component supplying port 15 is provided at one end portion of each of the component supplying apparatuses 14. Each of the component supplying apparatuses 14 is mounted on the corresponding one of the arranging portions 60 for the component supplying apparatuses 14 such that the end portion to which the component supplying port 15 is provided faces the component mounting area M side. The sucking nozzle 8 extracts the electronic component 13 via the component supplying port 15. As described above, an area of the sucking nozzle 8 when extracting the electronic component 13 or the area of the head 35 at that time (area including operating position) is set as a component supplying area S. The sucking nozzle 8 of the head 35 at the operating position moves inside the component supplying area S, the component mounting area M, and an area connecting those areas S and M.

First, the head 35 moves to the component supplying area S and sequentially sucks given electronic components 13 using 12 sucking nozzles 8 provided to the nozzle holding portion 7. Then, the head 35 moves to the component mounting area M and sequentially mounts the components sucked by the sucking nozzle 8 at predetermined positions on the circuit board 9 while adjusting movements in the X- and Y-axis directions. The movements of the head 35 in the X- and Y-axis directions are carried out by the moving member 6 and the supporting portion 18 described above. By repeating this operation, the electronic components 13 are mounted on the circuit board 9.

In this embodiment, two heads 35 are provided. In FIG. 2, for example, it is possible for one of the heads 35 to extract the electronic components 13 from the component supplying apparatuses 14 disposed on the right-hand side and the other one of the heads 35 to extract the electronic components 13 from the component supplying apparatuses 14 disposed on the left-hand side. Alternatively, it is also possible for one of the heads 35 to mount the electronic components 13 on the circuit board 9 provided on an upper side in FIG. 2, and the other one of the heads 35 to mount the electronic components 13 on the circuit board 9 provided on a lower side in FIG. 2.

Figure 4:
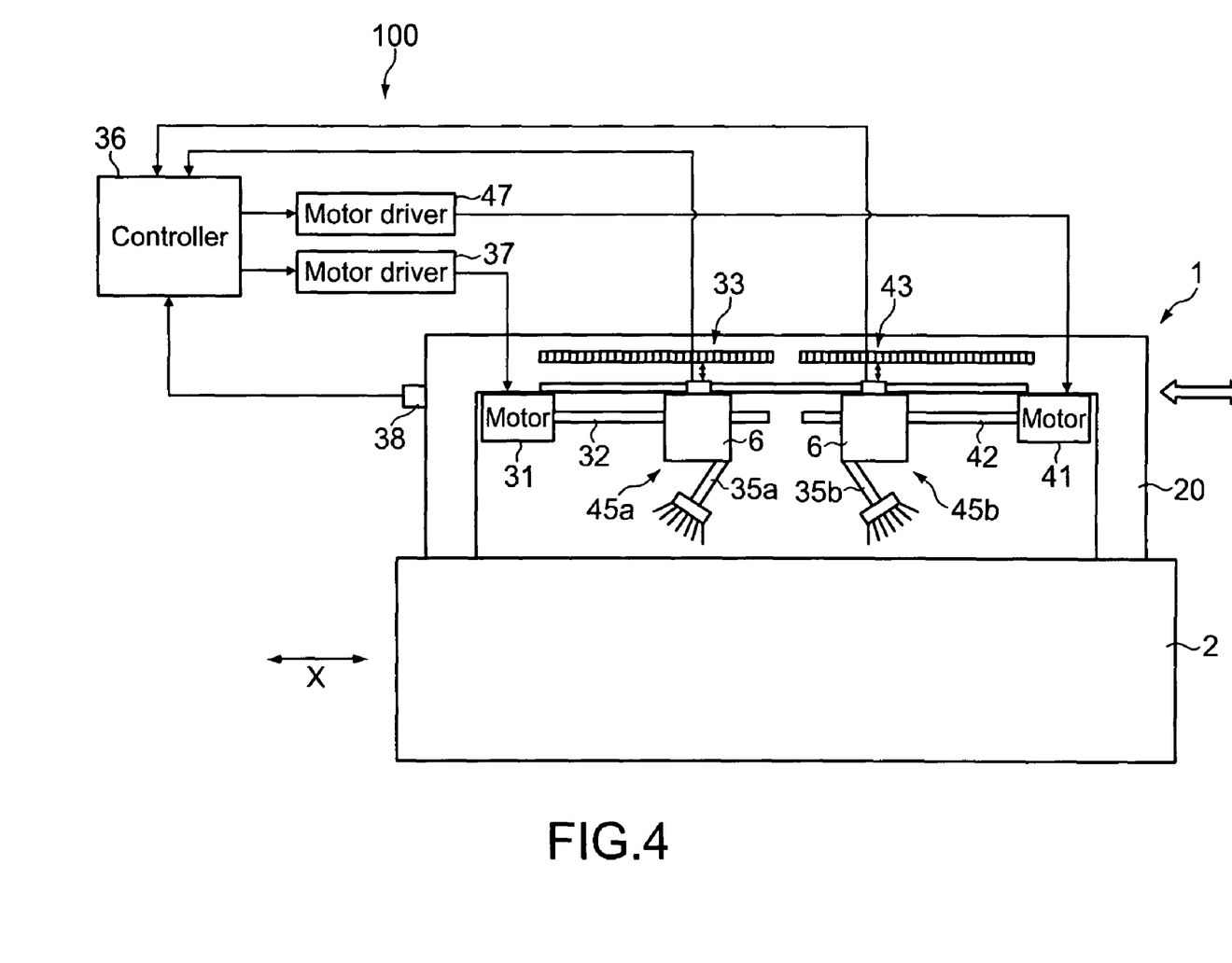
FIG. 4 is a block diagram showing a vibration controlling apparatus according to an embodiment of the present invention, which is applied to the component mounting apparatus.

FIG. 4 is a block diagram showing a vibration controlling apparatus according to an embodiment of the present invention, which is applied to the component mounting apparatus 1.

The frame structure 20 includes motors 31 and 41 and ball screws 32 and 42 connected to the motors 31 and 41 and the moving members 6, the motors and ball screws being included in the driving mechanism 30. In FIG. 4, the component mounting apparatus 1 is shown schematically, and a gear, a coupling, and the like (not shown) are typically provided between the motor 31 (41) and the ball screw 32 (42). In the descriptions of FIG. 4, the base portion 2 will be described as fixed and unmovable regarding an absolute coordinate system (i.e., inertial system).

It should be noted that in descriptions below, the head 35 connected to the motor 31 will be referred to as head 35a and the head 35 connected to the motor 41 will be referred to as head 35b for convenience. Moreover, for convenience, the moving member 6 and the head 35a will be referred to as "head unit 45a" whereas the moving member 6 and the head 35b will be referred to as "head unit 45b".

A vibration controlling apparatus 100 includes linear scales 33 and 43 of the frame structure 20 that measure positions of the head units in the X-axis direction, and a vibration detector 38 for detecting a vibration of the frame structure 20 substantially in the X-axis direction and outputting detection information thereof. The vibration controlling apparatus 100 further includes a controller 36 to which the detection information output from the vibration detector 38 and positional information of the heads 35a and 35b output from the linear scales 33 and 43 (positional information of the head units 45a and 45b) are input.

Based on the input vibration detection information and positional information of the heads 35a and 35b, the controller 36 carries out a predetermined operation and controls motor drivers 37 and 47 that respectively drive the motors 31 and 41 based on the operational data. Thus, even when the frame structure 20 is vibrated, the positions of the heads 35a and 35b are compensated in the absolute coordinate system by the driving of the motors 31 and 41.

Typically, the vibration detector 38 is an acceleration sensor, but may alternatively be a velocity sensor, a displacement sensor, or the like. As the acceleration sensor, any type of sensors such as a piezoresistive sensor, a piezoelectric sensor, and a capacitance sensor may be used. When using the acceleration sensor, an acceleration value of the frame structure 20 generated by the vibration is input to the controller 36 as the detection information, and the controller 36 carries out a second-order integration operation on the acceleration value, for example, to generate displacement information. Alternatively, when the vibration detector 38 is a displacement sensor, the vibration detector 38 outputs displacement information as the detection information, which is then input to the controller 36. In other words, among a part of the controller 36 and the vibration detector 38, at least the vibration detector 38 constitutes an outputting means.

The controller 36 includes a CPU (Central Processing Unit), a RAM (Random Access Memory), a ROM (Read Only Memory), and the like (all of which are not shown). It is also possible to use a DSP (Digital Signal Processor), an FPGA (Field Programmable Gate Array), an ASIC (Application Specific Integrated Circuit), or the like instead of the CPU.

It should be noted that the vibration controlling apparatus 100 according to this embodiment only needs to be applied when the circuit board 9 is fixed to the base portion 2, that is, fixed in the absolute coordinate system.

Figure 5:
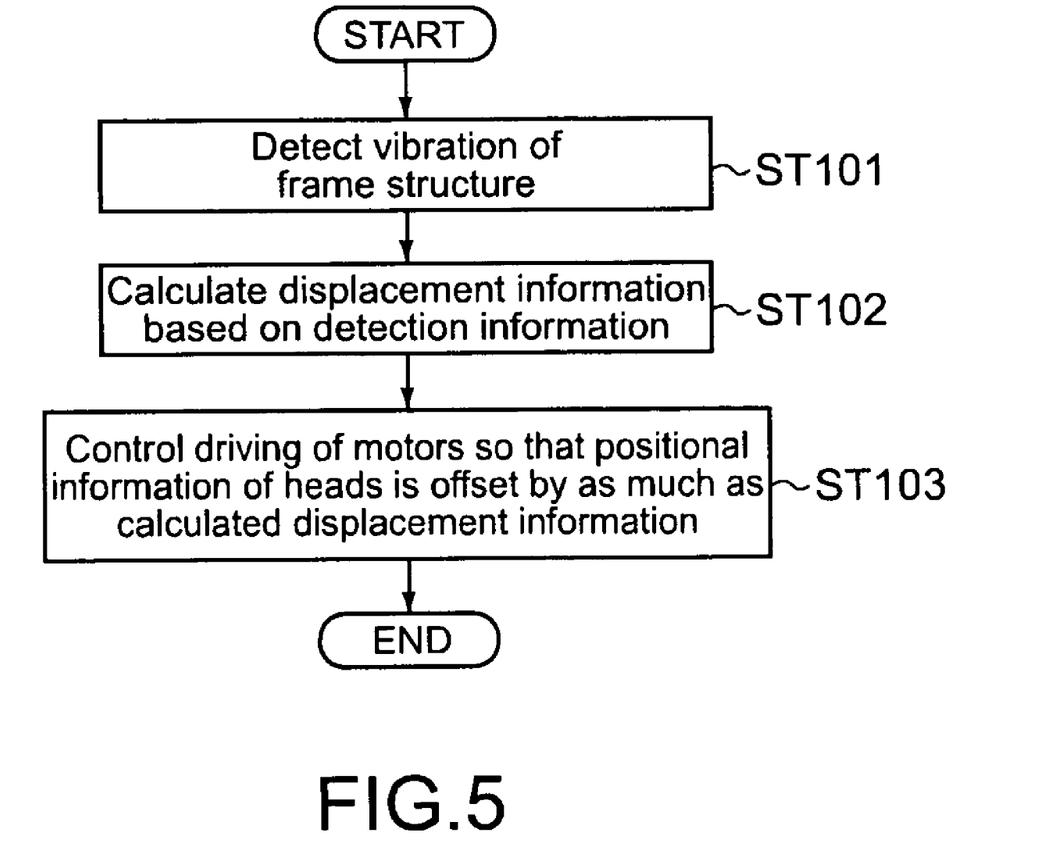
FIG. 5 is a flowchart showing an operation of the vibration controlling apparatus.

An operation of the vibration controlling apparatus 100 structured as described above will be described. FIG. 5 is a flowchart showing the operation. Hereinafter, the moving head is the head 35a and the stopped one is the head 35b.

When the head 35a moves rightward in the X-axis direction in FIG. 4, for example, the frame structure 20 moves leftward by a repulsive force caused by the movement of the head 35a. After that, the frame structure 20 bounces back by a spring force. The frame structure 20 thus vibrates at a predetermined frequency, that is, 20 to 50 Hz (the range is not limited thereto and varies depending on a mass, shape, and the like of the frame structure 20), for example. Because the frame structure 20 vibrates at the frequency above while the head 35a is moving rightward or leftward in the X-axis direction, the head 35a is moving rightward or leftward in the X-axis direction while vibrating at the frequency above, when considering the absolute coordinate system (fixed system with base portion 2 as reference). Further, when the frame structure 20 is vibrated, a frictional resistance force between the head unit 45b including the head 35b and the frame structure 20 causes the head 35b to also vibrate. The vibration controlling apparatus 100 according to this embodiment has been made to absorb such vibrations of the heads 35a and 35b.

The vibration detector 38 detects the vibration of the frame structure 20 and outputs detection information thereof (Step 101).

The controller 36 is input with the detection information. If the detection information is an acceleration value, the controller 36 subjects the acceleration value to a second-order integration to calculate displacement information (Step 102). In other words, the displacement information is a vibration amplitude of the frame structure 20. If the detection information is a velocity value, a first-order integration operation only needs to be carried out, and there is no need for an integration operation if the detection information is a displacement.

Alternatively, it is also possible for the controller 36 to calculate, if the detection information is an acceleration value, the velocity value by subjecting the acceleration value to a first-order integration operation. This is because, if the velocity value is calculated at a predetermined cycle, that is, per unit time, the controller 36 can generate displacement information per unit time.

When moving the head 35a, the controller 36 is obtaining positional information of the head unit 45a (i.e., head 35a) from the linear scale 33 at a predetermined cycle. Moreover, the controller 36 also obtains positional information of the head 35b that is kept stopped from the linear scale 43 at a predetermined cycle. After calculating the displacement information in Step 102, the controller 36 controls the driving of the motors 31 and 41 so that the positional information of the heads 35a and 35b respectively obtained from the linear scales 33 and 43 is offset by as much as the displacement information (Step 103).

Typically, after calculating the displacement information, the controller 36 performs addition/subtraction using the positional information of the motor 31 and the calculated displacement information in Step 103. The same holds true for the motor 41. The controller 36 then outputs to the motor drivers 37 and 47 the positional information that has been subjected to the addition/subtraction, as information for driving the motor drivers 37 and 47. Accordingly, the motor drivers 37 and 47 can move the head 35a while inhibiting vibrations of the heads 35a and 35b in the absolute coordinate system.

For example, assuming that the head 35a is moved rightward while the head 35b is kept stopped, when the frame structure 20 vibrates rightwardly (or leftwardly) in this state, the controller 36 outputs information on a value obtained by subtracting (or adding) the displacement information from (to) the positional information to the motor drivers 37 and 47.

As described above, even when the frame structure 20 is vibrated, the position of the head 35 is compensated based on the displacement information caused by the vibration of the frame structure 20. Therefore, an absolute movement position of the head 35 is secured, thus enabling a highly-precise positioning of the head 35 with respect to the circuit board 9.

In this embodiment, since the vibration of the frame structure 20 is allowable, there is no need to enhance rigidity of the frame structure 20.

Further, when moving the head 35a while the head 35b is kept stopped, for example, in the case of ball screw drive, only a negligible amount of energy is required for keeping the stopped state of the head 35b that is already stopped in the absolute coordinate system. This is because the head 35b that is kept stopped tries to remain at that position due to the law of inertia. In this case, only the following 3 energies are required for the vibration controlling apparatus 100 to keep the stopped state of the head 35 that is already stopped in the absolute coordinate system.
1. torque for accelerating/decelerating motor and ball screw
2. torque against resistance generated between head unit and ball screw
3. torque against resistance generated between head unit and guide rail 11

Heretofore, the operation carried out when the head 35a moves while the head 35b is kept stopped has been described. The principle is also applied to the case of moving both the heads 35a and 35b. The vibration of the frame structure 20 caused when both the heads 35a and 35b move independently is expressed by a waveform obtained by superimposing two sinusoidal waves, that is, in the form of a Fourier series. When an acceleration sensor is used as the vibration detector 38, the acceleration sensor detects the vibration superimposed as described above, and the controller 36 subjects the vibration to the second-order integration, to similarly obtain the displacement information.

Here, although a second-order integration is carried out for generating the displacement information when the acceleration sensor is used as the vibration detector 38, the following operation may be carried out when an accumulated error becomes large.

For example, when the output value of the acceleration sensor becomes equal to or smaller than a threshold value, that is, substantially 0 m/s$^2$ in a quintessential manner, the controller 36 only needs to reset the displacement information of the frame structure 20 to 0 (judging means, resetting means). A fundamental vibration of the frame structure 20 becomes a sinusoidal wave, and the vibration after the second-order integration becomes a negative sinusoidal wave. Thus, the displacement also becomes 0 when the acceleration is 0. Therefore, because the displacement information is reset to 0 when the acceleration is substantially 0, generation of accumulated errors in the integration operations can be suppressed.

When a plurality of heads 35 are provided as in the above embodiment, the vibration of the frame structure 20 does not become a simple sinusoidal wave as described above. However, because all the waveforms can be expressed by a combination of sinusoidal waves, there is no problem even when the plurality of heads 35 are moved independently at the same time. In other words, for obtaining a displacement d from an acceleration A obtained by addition in the form of a Fourier series, d=−K*A (* represents multiplication) is used. Therefore, when A=0, d eventually becomes 0.

Figure 6:
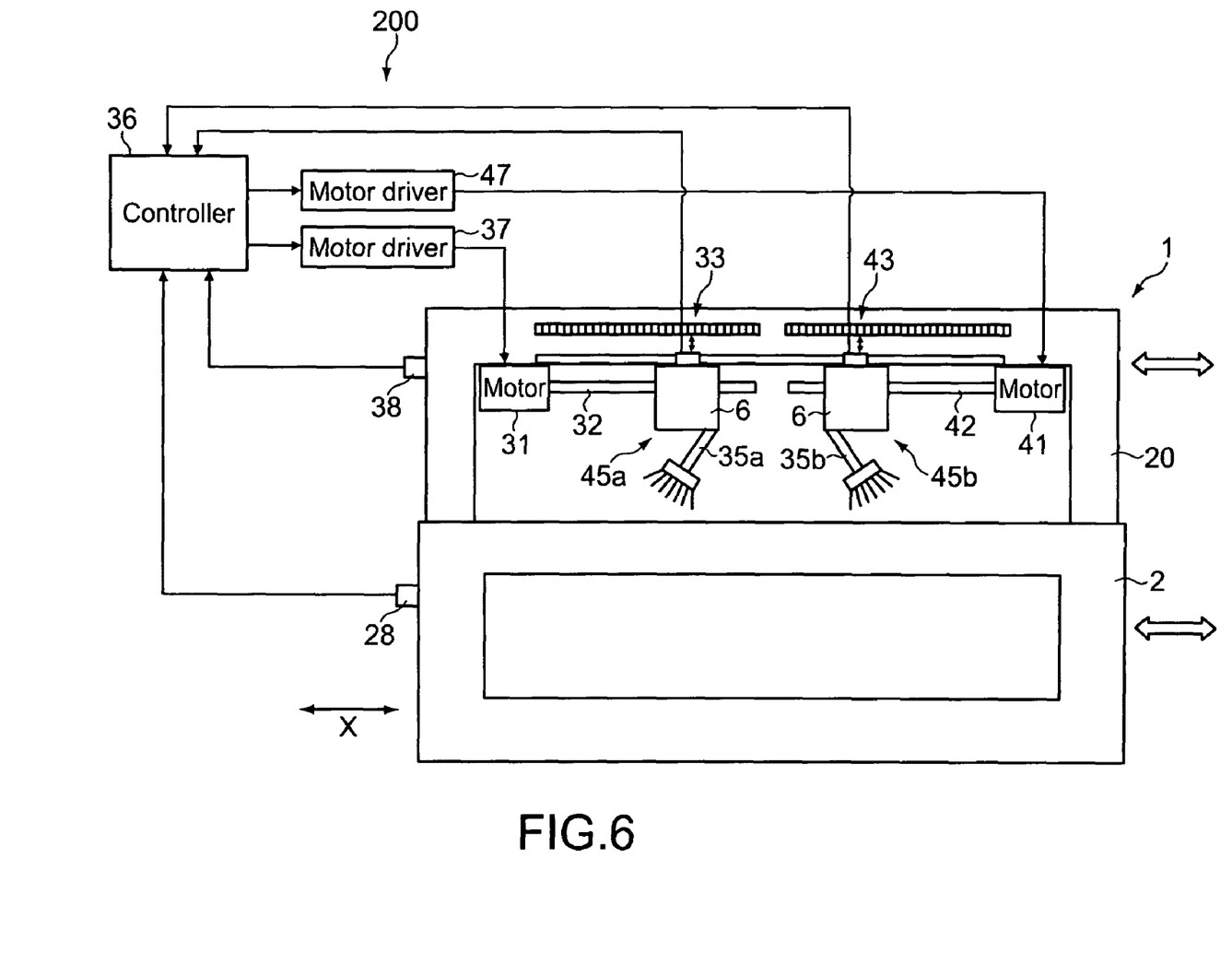
FIG. 6 is a block diagram showing a vibration controlling apparatus according to another embodiment of the present invention.

FIG. 6 is a block diagram showing a vibration controlling apparatus according to another embodiment of the present invention.

A vibration controlling apparatus 200 of this embodiment is different from the vibration controlling apparatus 100 shown in FIG. 4 in that not only the frame structure 20 but also the base portion 2 is vibrated when at least one of the heads 35a and 35b moves in the X-axis direction.

In this embodiment, a first vibration detector 38 is attached to the frame structure 20, and a second vibration detector 28 is attached to the base portion 2. The second vibration detector 28 typically is the same as the first vibration detector 38, and an acceleration sensor may be used for both detectors, for example. However, different types of sensors may also be used for the first vibration detector 38 and the second vibration detector 28. The second vibration detector 28 detects a vibration of the base portion 2, and detection information thereof is input to the controller 36.

Figure 7:
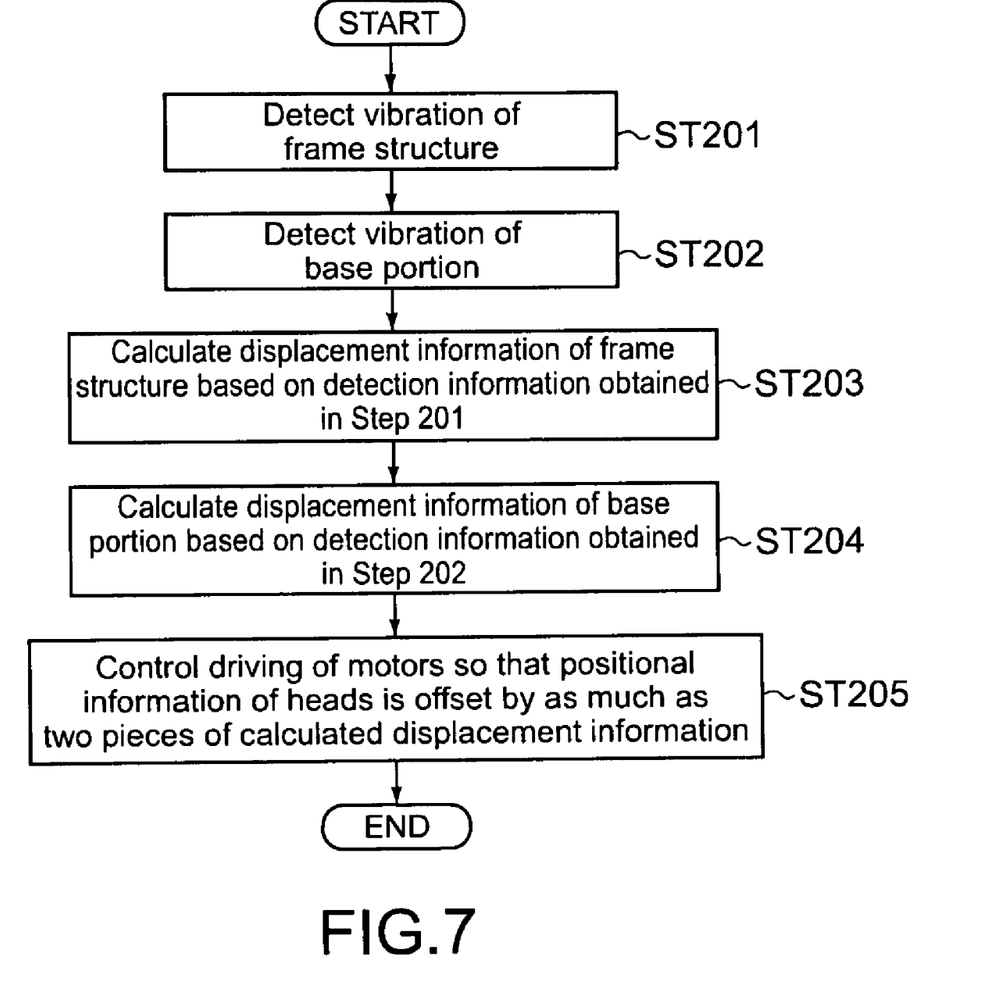
FIG. 7 is a flowchart showing an operation of the vibration controlling apparatus shown in FIG. 6.

FIG. 7 is a flowchart showing an operation of the vibration controlling apparatus 200 shown in FIG. 6.

The first vibration detector 38 detects a vibration of the frame structure 20 and outputs detection information (Step 201). Similarly, the second vibration detector 28 detects a vibration of the base portion 2 and outputs detection information (Step 202). Steps 201 and 202 only need to be executed substantially in sync.

The controller 36 is input with the detection information from the first vibration detector 38 and the second vibration detector 28. Based on the detection information from the first vibration detector 38, the controller 36 calculates displacement information of the frame structure 20 (Step 203). Further, based on the detection information from the second vibration detector 28, the controller 36 calculates displacement information of the base portion 2 (Step 204). The controller 36 controls the driving of the motors 31 and 41 so that positional information of the heads is offset by as much as the two pieces of calculated displacement information (Step 205).

Typically, the controller 36 first adds two pieces of displacement information in Step 205. The two pieces of displacement information in this case each take either a positive or negative value. In other words, the frame structure 20 and the base portion 2 may both move rightward or leftward in the X-axis direction, or may move in directions opposite to each other. Then, the controller 36 performs addition/subtraction using the positional information of the motor 31 and the added displacement information. The same holds true for the motor 41. The controller 36 then outputs to the motor drivers 37 and 47 the positional information that has been subjected to the addition/subtraction, as information for driving the motor drivers 37 and 47. Accordingly, the motor drivers 37 and 47 can move at least one of the heads 35a and 35b while inhibiting vibrations of the heads 35a and 35b in the absolute coordinate system.

Hereinafter, descriptions will be given on a case where, when the vibration controlling apparatus 100 or 200 of the above embodiments is applied to the component mounting apparatus 1, a movement time of the heads 35a and 35b is shortened and a throughput is improved, the effect of which will be described using actual parameters (numerical values) included in the component mounting apparatus 1. Specifically, descriptions will be given on a case where a single head 35 includes, for example, 12 sucking nozzles 8.

(1) time during which head 35 is stopped for operation of sucking electronic component 13 and mounting it on circuit board 9: 25 ms
(2) time for selecting sucking nozzle 8: 33 ms
(3) time required for head 35 to move 30 mm
  a. component mounting apparatus of related art equipped with two heads 35: 113 ms
  b. component mounting apparatus of related art equipped with only one head 35: 93 ms
  c. time thereof when vibration controlling apparatus of this embodiment is applied: 68 ms
(4) time required for each electronic component 13 to reciprocate between area S and area M: 30 ms
  a. component mounting apparatus of related art equipped with two heads 35: 30 ms
  b. component mounting apparatus of related art equipped with only one head 35: 20 ms A time obtained by combining those reference times becomes a tact time, and an inverse number of the tact time represents performance. For items (2) and (3), because (2) selection of sucking nozzle 8 and (3) movement of head 35 can be carried out at the same time, 33 ms of the item (2) is necessary however short the movement distance is.

In other words, when a plurality of (e.g., 12) electronic components 13 are extracted successively from a single extracting position of the electronic components 13, the head 35 does need to move while the electronic components 13 are being extracted. In this case, when the 12 electronic components 13 are mounted at positions close to each other on the circuit board 9, the following tact times are obtained (* represents multiplication).

1. component mounting apparatus of related art equipped with two heads 35:

$((1)+(2))*2+(4)=(25+33)*2+30=146$ ms 2. component mounting apparatus of related art equipped with only one head 35:

$((1)+(2))*2+(4)=(25+33)*2+20=136$ ms

The tact times above are called catalogue tact times and are extremely ideal. In actuality, the tact time is prolonged by the movement time of the item (3). The following calculations are given when simply assuming that the extraction and mounting of the electronic component 13 are both accompanied by a 30-mm movement.

Related Art 1. component mounting apparatus of related art equipped with two heads 35:

$((1)+(3))*2+(4)=(25+113)*2+30=306$ ms 2. component mounting apparatus of related art equipped with only one head 35:

$((1)+(3))*2+(4)=(25+93)*2+20=256$ ms

This Embodiment 1. component mounting apparatus of this embodiment equipped with two heads 35:

$((1)+(3))*2+(4)=(25+68)*2+30=216$ ms 2. component mounting apparatus of this embodiment equipped with only one head 35:

$((1)+(3))*2+(4)=(25+68)*2+20=206$ ms

In other words, improvement rates of performance when simply moving the head 35 30 mm according to this embodiment are as follows.

1. in a case of two heads 35: 306 ms/216 ms=1.42, which is a 42%-improvement in performance
2. in a case of one head 35: 256 ms/206 ms=1.24, which is a 24%-improvement in performance This shows an improvement in basic performance of the component mounting apparatus 1, and when expressing the effect in sum, a value can be obtained by multiplying a cost of the entire component mounting apparatus by the improvement rate. In other words, a component mounting apparatus that costs 10,000,000 yen bears an effect of about 4,200,000 yen per item.

An embodiment of the present invention is not limited to the above embodiments, and various other embodiments may also be employed.

FIGS. 1 to 3, 4, and 6 have been described about the component mounting apparatus 1 that includes two heads 35. However, the vibration controlling apparatuses 100 and 200 can also be applied to a component mounting apparatus equipped with only one head 35.

Although the linear scales 33 and 43 have been used in the descriptions above, a rotary encoder may be used instead.

Moreover, the vibration controlling apparatuses 100 and 200 are applicable to not only the component mounting apparatus 1 but also every apparatus that includes a frame structure and a movable body with respect to the frame structure. Examples of the apparatus include any apparatus such as an exposure apparatus and a carrier apparatus for carrying components and works.

What is claimed is:

1. A component mounting apparatus mounting a component on a substrate, comprising:
   a driving unit including a head to hold the component and a driving mechanism to move the head;
   a frame structure equipped with the driving unit;
   a base portion to support the frame structure;
   a first outputting means attached to the frame structure for detecting a vibration of the frame structure and outputting first displacement information as displacement information of the frame structure caused by the detected vibration; and
   a compensating means for compensating a position of the head that moves by the driving mechanism based on the first displacement information.

2. The component mounting apparatus according to claim 1,
   wherein the head is one of a plurality of heads included in the driving unit,
   wherein the driving mechanism moves each of the plurality of heads independently, and
   wherein the compensating means compensates the position of each of the plurality of heads that moves by the driving mechanism based on the first displacement information.

3. The component mounting apparatus according to claim 1,
   wherein the compensating means causes the driving mechanism to drive so that positional information of the head is offset by as much as the first displacement information.

4. The component mounting apparatus according to claim 1,
   wherein the first outputting means includes
   an acceleration sensor to detect an acceleration of the vibration of the frame structure,
   a generating means for generating the first displacement information by integrating the acceleration value,
   a judging means for judging whether the acceleration value detected by the acceleration sensor is equal to or smaller than a threshold value, and
   a resetting means for resetting the first displacement information to 0 when the acceleration value is equal to or smaller than the threshold value.

5. A component mounting apparatus mounting a component on a substrate, comprising:
   a driving unit including a head to hold the component and a driving mechanism to move the head;
   a frame structure equipped with the driving unit;
   a base portion to support the frame structure;
   a vibration detector attached to the frame structure configured to detect a vibration of the frame structure and output first displacement information as displacement information of the frame structure caused by the detected vibration; and
   a controller configured to compensate a position of the head that moves by the driving mechanism based on the first displacement information.

6. The component mounting apparatus according to claim 5,
wherein the head is one of a plurality of heads included in the driving unit, wherein the driving mechanism moves each of the plurality of heads independently, and wherein the controller is configured to compensate the position of each of the plurality of heads that moves by the driving mechanism based on the first displacement information.

7. The component mounting apparatus according to claim 5, wherein the controller is configured to cause the driving mechanism to drive so that positional information of the head is offset by as much as the first displacement information.

8. The component mounting apparatus according to claim 5, wherein the vibration detector includes an acceleration sensor to detect an acceleration of the vibration of the frame structure, and wherein the controller is configured to generate the first displacement information by integrating the acceleration value, determine whether the acceleration value detected by the acceleration sensor is equal to or smaller than a threshold value, and reset the first displacement information to 0 when the acceleration value is equal to or smaller than the threshold value.

9. The component mounting apparatus according to claim 1, wherein the frame structure comprises a beam member and a pillar member.

10. The component mounting apparatus according to claim 5, wherein the frame structure comprises a beam member and a pillar member.

* * * * *